(12) United States Patent
Peting et al.

(10) Patent No.: US 12,385,959 B2
(45) Date of Patent: Aug. 12, 2025

(54) METHOD AND SYSTEM FOR COMPONENT MISMATCH COMPENSATION

(71) Applicant: SKYWORKS SOLUTIONS, INC., Irvine, CA (US)

(72) Inventors: Mark R. Peting, Yamhill, OR (US); Dale A. Beyer, Portland, OR (US); Donald Allen Pearce, Beaverton, OR (US); Miles Reuben Thompson, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 504 days.

(21) Appl. No.: 17/936,458

(22) Filed: Sep. 29, 2022

(65) Prior Publication Data

US 2023/0096484 A1    Mar. 30, 2023

Related U.S. Application Data

(60) Provisional application No. 63/250,755, filed on Sep. 30, 2021.

(51) Int. Cl.
*H03F 3/45* (2006.01)
*G01R 29/08* (2006.01)
*H03F 3/195* (2006.01)

(52) U.S. Cl.
CPC ......... *G01R 29/0871* (2013.01); *H03F 3/195* (2013.01); *H03F 2200/451* (2013.01)

(58) Field of Classification Search
CPC ...................................................... H03F 3/45
USPC ................................................ 330/260, 261
See application file for complete search history.

(56) References Cited

U.S. PATENT DOCUMENTS

| | | | |
|---|---|---|---|
| 7,443,200 B2 | 10/2008 | Quinn et al. | |
| 8,207,788 B2 | 6/2012 | Lee et al. | |
| 2018/0337636 A1 | 11/2018 | Martinez et al. | |
| 2018/0337645 A1 | 11/2018 | Link et al. | |
| 2019/0214950 A1 | 7/2019 | Quinn | |
| 2020/0228076 A1 | 7/2020 | Lee | |
| 2021/0012763 A1 | 1/2021 | Wurtz | |

*Primary Examiner* — Henry Choe
(74) *Attorney, Agent, or Firm* — Lando & Anastasi, LLP

(57) ABSTRACT

A method and system of compensating for component mismatch are disclosed. An example system comprises an amplifier including a current ratio measurement engine (CRME) and a modulator (DSM). The CRME is configured to obtain measurements for each possible configuration of an amplifier circuit and to pass these measurements to a processor for analysis. In the example system, the measurements are obtained by driving a bias current through two or more circuit elements and measuring the ratio in current between the two or more circuit elements, which is representative of the relative mismatch between the two or more components. The DSM is configured to receive adjustment parameters from the processor and to tune the amplifier circuit according to the adjustment parameters to thereby improve the performance of the amplifier.

20 Claims, 8 Drawing Sheets

METHOD AND SYSTEM FOR COMPONENT MISMATCH COMPENSATION

CROSS-REFERENCE TO RELATED APPLICATIONS

This application claims priority under 35 U.S.C. § 119(e) to U.S. Provisional Application No. 63/250,755, titled METHOD AND SYSTEM FOR COMPONENT MISMATCH COMPENSATION, filed Sep. 30, 2021, which is incorporated in its entirety by reference for all purposes.

BACKGROUND

Field

Embodiments of the invention relate to the field of wireless communication devices, and more particularly to testing components of electronic communication devices.
Description of the Related Technology Wireless communication devices typically include audio signal amplifiers to drive internal loudspeakers. The audio signal amplifiers can be Class-D, or switching, amplifiers to control an output device such as an internal loudspeaker.

The performance of these wireless communication devices may be tested using known automated computer-driven approaches to test components such as semiconductors, electronic circuits, and printed circuit board assemblies within the device under test (DUT).

SUMMARY

According to one embodiment there is provided, a method of compensating for component mismatch in an amplifier circuit, the method comprises providing a first circuit configuration that includes two or more circuit elements from a plurality of circuit elements within the amplifier circuit, driving a bias current through the two or more circuit elements and measuring a ratio of the current between each circuit element, repeating the above steps for each of a plurality of further circuit configurations to obtain a plurality of current ratio measurements, providing the current ratio measurements to a processor, receiving, from the processor, a set of adjustment parameters that are calculated based on the current ratio measurements, and reconfiguring the amplifier circuit in accordance with the set of adjustment parameters received from the processor.

In one example each of the plurality of further circuit configurations is provided by changing the arrangement of the two or more circuit elements, and/or by changing a value associated with the two or more circuit elements.

In one example one or more different circuit configurations are provided by adjusting an internal resistor network with a plurality of switches.

In one example one or more different circuit configurations are provided by selecting either a resistive path associated with a high output resistance mode or a resistive path associated with a zero output resistance mode with an internal resistor network controller.

In one example one or more different circuit configurations are provided by activating a subset of transistors within a digital-to-analog converter with a dynamic element matching component.

In one example one or more different circuit configurations are provided by activating a subset of transistors within a common mode limit amplifier with a common mode limit amplifier controller.

In one example each of the plurality of circuit configurations is monitored and iteratively selected using a finite state machine.

In one example the circuit elements are resistors, transistors or capacitors.

In one example the strength of the bias current driven through the two or more circuit elements is determined by the selected values of the two or more circuit elements.

In one example the strength of the bias current driven through the two or more circuit elements ensures that a loop filter amplifier in the amplifier circuit remains within a common mode of operation.

In one example the common mode of operation for the loop filter amplifier is between 150 to 300 mV.

In one example the amplifier circuit forms at least part of a Class-D amplifier.

In one example the current ratio measurements are obtained from an output of a loop filter amplifier.

In one example the set of received adjustment parameters are stored in an on-chip one-time programmable memory.

In one example the plurality of current ratio measurements are provided to the processor via an on-chip first-in first-out memory.

In one example the processor is an automatic test equipment.

In one example each of the plurality of current ratio measurements may be an average current ratio determined during a measurement gathering interval.

In one example each of the plurality of current ratio measurements may be an average current ratio determined during a measurement gathering interval that lasts for 0, 5.2, 10.4, 20.8, 41.6, 83.2, 166.4, or 332.8 microseconds.

According to another embodiment there is provided a system of compensating for component mismatch in an amplifier circuit comprising an amplifier circuit including a plurality of circuit elements, a current ratio measurement engine configured to provide a plurality of circuit configurations, each configuration including two or more circuit elements of the plurality of circuit elements, a digital-to-analog converter configured to drive a bias current through the two or more circuit elements for each of the plurality of circuit configurations to obtain a plurality of current ratio measurements, a modulator configured to receive a set of adjustment parameters that are calculated based on the plurality of current ratio measurements and further configured to reconfigure the amplifier circuit in accordance with the set of adjustment parameters.

In one example the system further comprises a plurality of switches configured to provide one or more different circuit configurations by adjusting an internal resistor network.

In one example the system further comprises an internal resistor network controller configured to provide one or more different circuit configurations by selecting either a resistive path associated with a high output resistance mode or a resistive path associated with a zero output resistance mode.

In one example the system further comprises a dynamic element matching component configured to activate a subset of transistors within the digital-to-analog converter to thereby provide one or more different circuit configurations.

In one example the system further comprises a common mode limit amplifier controller configured to activate a subset of transistors within the common mode limit amplifier to thereby provide one or more different circuit configurations.

In one example the circuit elements are implemented in one or more of a loop filter amplifier, a digital-to-analog converter, a common mode limit amplifier, and an amplifier internal resistor network.

In one example the circuit elements are resistors, transistors, or capacitors.

In one example the amplifier circuit forms at least part of a Class-D amplifier.

In one example the system further comprises an on-chip one-time programmable memory configured to store the set of received adjustment parameters.

In one example the system further comprises an on-chip first-in first-out memory configured to provide the plurality of current ratio measurements to a processor.

In one example the current ratio measurement engine further comprises a finite state machine configured to monitor and iteratively select each of the plurality of circuit configurations of the amplifier circuit.

According to another embodiment there is provided a packaged module comprising a packaging substrate and an amplifier implemented on a packaging substrate, the amplifier comprising an amplifier circuit including a plurality of circuit elements, a current ratio measurement engine configured to provide a plurality of circuit configurations, each configuration including two or more circuit elements of the plurality of circuit elements, a digital-to-analog converter configured to drive a bias current through the two or more circuit elements for each of the plurality of circuit configurations to obtain a plurality of current ratio measurements, and a modulator configured to receive a set of adjustment parameters that are calculated based on the plurality of current ratio measurements and further configured to reconfigure the amplifier circuit in accordance with the set of adjustment parameters.

According to another embodiment there is provided an electronic device comprising an audio signal generator, an audio output, and an amplifier configured to amplify an audio signal, the amplifier comprising an amplifier circuit including a plurality of circuit elements, a current ratio measurement engine configured to provide a plurality of circuit configurations, each configuration including two or more circuit elements of the plurality of circuit elements, a digital-to-analog converter configured to drive a bias current through the two or more circuit elements for each of the plurality of circuit configurations to obtain a plurality of current ratio measurements, and a modulator configured to receive a set of adjustment parameters that are calculated based on the plurality of current ratio measurements and further configured to reconfigure the amplifier circuit in accordance with the set of adjustment parameters.

According to another embodiment there is provided a method of compensating for component mismatch in an electronic circuit comprising providing a plurality of circuit configurations, each configuration including a unique combination of two or more circuit elements, driving a bias current through the two or more circuit elements for each of the plurality of circuit configurations to obtain a plurality of current ratio measurements, providing the plurality of current ratio measurements to a processor, receiving, from the processor, a set of adjustment parameters that are calculated based on the current ratio measurements, and reconfiguring the electronic circuit in accordance with the set of adjustment parameters received from the processor.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
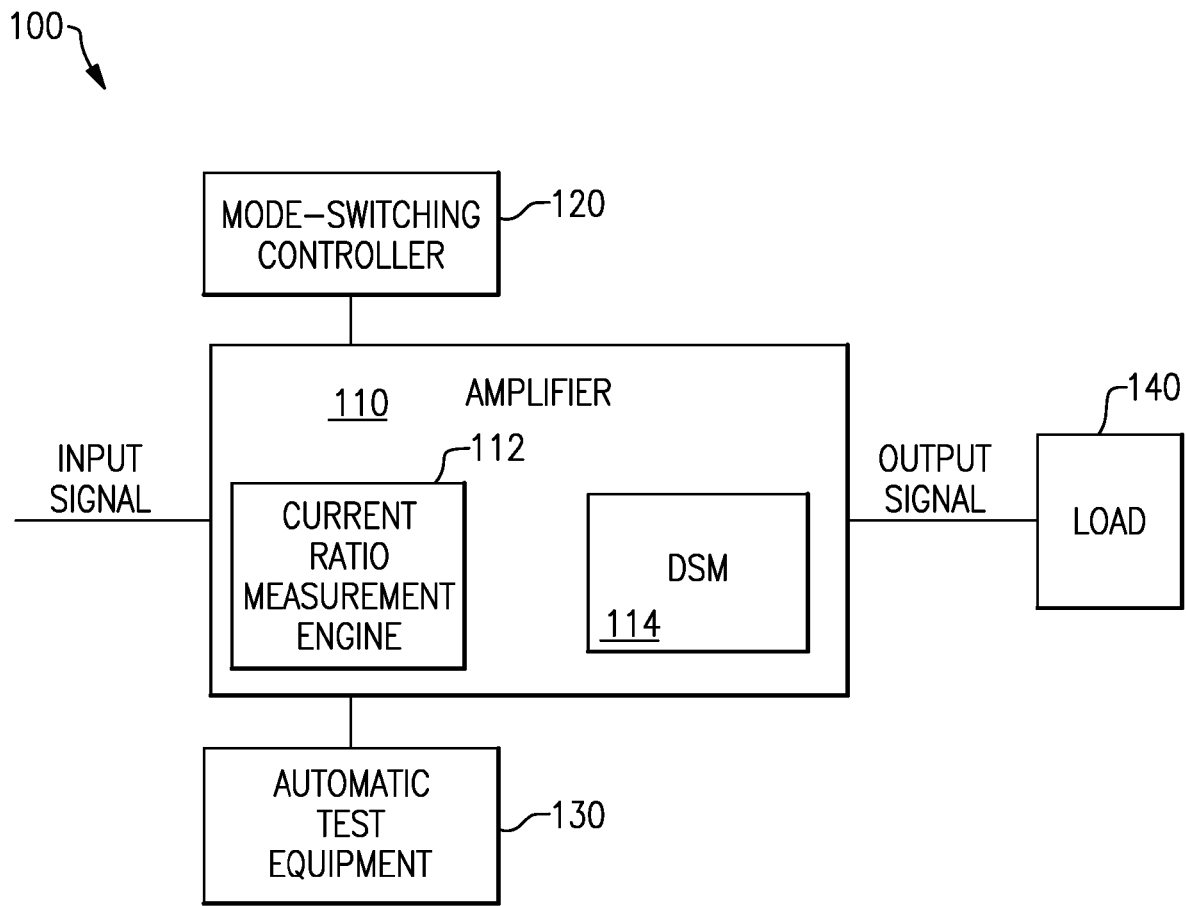
FIG. 1 is a schematic diagram of a device that includes an amplifier.

Aspects and embodiments described herein are directed to a current ratio measurement engine for obtaining on-die measurements through the utilization of existing components. This advantageously enables accurate measurement and die-specific tuning without requiring extensive additional circuitry.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

It is also to be appreciated that while many of the specific embodiments described below relate to testing a Class-D amplifier, the inventive concept may be applied generally wherever there is a need to properly match on-circuit-board components. For example, embodiments of the invention may be applied to any other class of amplifier or any electronic circuit that includes resistors, capacitors and transistors that must be precisely impedance matched.

Equally, although the detailed description below generally relates to a device-under-test (DUT) in the context of audio applications it will be appreciated that one or more features of the present disclosure can also be implemented in other types of signal delivery configurations, including non-audio applications.

Analog circuits are susceptible to component mismatch, whereby impedance mismatches and signal reflections between different circuit elements such as resistors, capacitors and transistors can lead to current loading and harmonic distortion. In reality, there will always be an element of component mismatch in electronic devices, even for two identically designed devices, due to the stochastic nature of physical processes that are used to fabricate the devices.

In highly tuned electronic devices, such as Class-D amplifiers, even a small amount of distortion will degrade the performance of the device and so it is important to be able to accurately measure and compensate for the distortion to comply with strict performance criteria.

However, measuring the component mismatch within an amplifier is difficult to achieve with a high degree of accuracy. Existing methods typically involve the use of automatic test equipment (ATE), but it is extremely difficult to obtain sufficiently high levels of accuracy using ATE without requiring high accuracy sensing within the amplifier, additional complicated circuitry that introduces parasitic signals, and very long integration times to average out noise and the parasitic signals. In addition, it is difficult to include additional circuitry in the area around a Class-D amplifier loop filter due to the high sensitivity of the loop filter.

By contrast, embodiments of the invention are able to utilize existing circuitry to provide measurements that are accurate to a high level of gain within a short period of time, for example 90 dB within 1 millisecond, as further described below.

FIG. 1 shows an example device 100 that includes an amplifier 110. The device 100 may be a wireless device. In the embodiment shown, the amplifier is configured to be controlled by a mode-switching controller 120 that provides switching signals to the amplifier in to enable the amplifier to switch between different modes of operation. The amplifier 110 comprises a current ratio measurement engine (CRME) 112 and delta sigma modulator (DSM) 114, as further described below. As shown in FIG. 1, the amplifier 110 may share data with a processor, such as automatic test equipment (ATE) 130 shown in FIG. 1, to perform automated testing and tuning of the amplifier 110. When in use, the amplifier 110 receives an input signal, which is amplified by the amplifier 110 to generate an amplified output signal. The amplified output signal is provided to a load 140, such as a speaker system.

Figure 2:
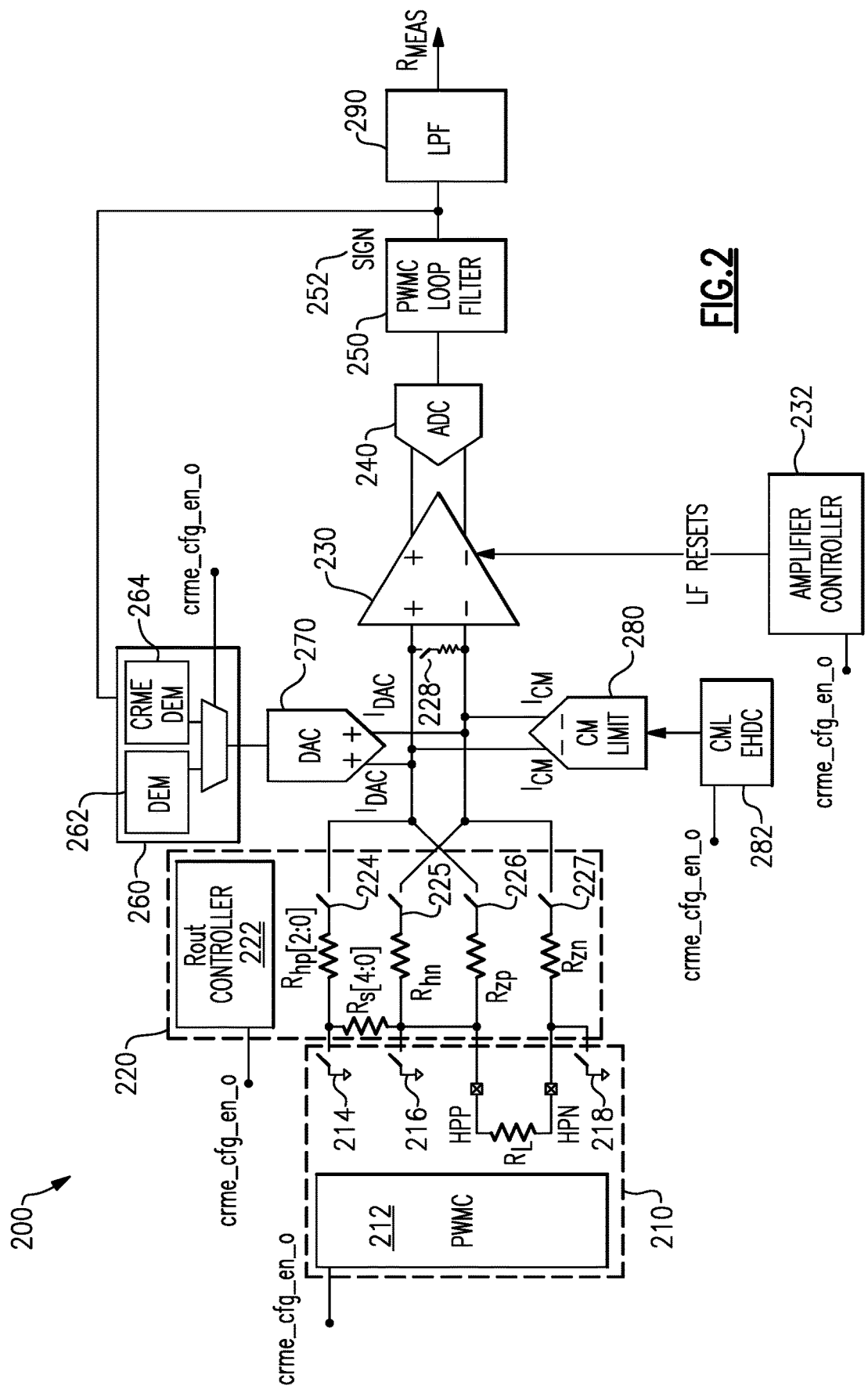
FIG. 2 is a schematic diagram of a system that includes a device under test (DUT)

FIG. 2 shows further detail of an example system 200 that includes a Class-D amplifier as a DUT. The example system 200 includes a pulse width modulation controller (PWMC) switch network 210, a resistor network 220, a loop filter 230, an analog-to-digital converter (ADC) 240, and a PWMC loop filter 250.

In the example shown, the PWMC switch network 210 includes a PWMC 212, a first PWMC switch 214, a second PWMC switch 216, and a third PWMC switch 218. The PWMC controls the operation of PWMC switches 214, 216, 218 and closing one or more of PWMC switches 214, 216, 218 results in grounding part of the resistor network 220. Accordingly, the PWMC 212 is configured to adjust the resistor network 220 in order to provide a number of different amplifier circuit configurations.

The resistor network 220 includes an $R_{out}$ controller 222, resistors $R_{hp}$ and $R_{zp}$ connected to a positive voltage rail (for example, the voltage rail coupled to the positive input of the loop filter 230), resistors $R_{hn}$ and $R_{zn}$ connected to a negative voltage rail (for example, the voltage rail coupled to the negative input of the loop filter 230). Resistors $R_{hp}$ and $R_{hn}$ are input network resistors for when the amplifier is configured to operate in a high output resistance (HOR) mode while resistors $R_{zp}$ and $R_{zn}$ are input network resistors for when the amplifier is configured to operate in a zero output resistance (ZOR) mode.

The resistor network 220 further includes an internal sense resistor $R_s$ that is used to sense the current within the chip during HOR mode. Resistor $R_s$ is connected between the positive and negative voltage rails, and internal $R_h$ resistors connect across $R_s$ from the internal loop filter. The resistor network 220 further includes an external off-chip resistive load, $R_L$, which is connected via terminals HPP and HPN. Resistor $R_L$ is connected between the positive and negative voltage rails, and internal $R_z$ resistors connect across $R_L$ from the internal loop filter.

The resistor network 220 also includes a first R-network switch 224, a second R-network switch 225, a third R-network switch 226, and a fourth R-network switch 227. The first and third R-network switches 224, 226 are connected to the positive voltage rail. The second and fourth R-network switches 225, 227 are connected to the negative voltage rail. As shown in FIG. 2, resistors $R_s$ and $R_L$ are connected between the positive and negative voltage rails, where $R_L$ may be the load resistance of a speaker, or a fixed resistance provided by the ATE. The resistor network may also include an offset switch 228 to enable an offset resistance $R_{off}$ between the input terminals of the loop filter 230. The $R_{out}$ controller 222 provides control signals to R-network switches 224-228 in order to select between either an $R_h$ path that includes resistors $Rh_p$, $R_{hd}$, and $R_s$, or an $R_z$ path that includes $R_{zp}$, $R_{zn}$, and $R_L$. Accordingly, the $R_{out}$ controller is configured to adjust the resistor network 220 to provide a number of different amplifier circuit configurations.

In preferred embodiments, the loop filter 230 is a 100 dB gain amplifier that regulates the operation of the Class-D amplifier. As shown in FIG. 2, an amplifier controller 232 may provide control signals to loop filter 230 to adjust the mode of operation of the loop filter 230. Accordingly, the amplifier controller 232 is configured to adjust the loop filter 230 to provide a number of different amplifier circuit configurations.

The amplifier shown in FIG. 2 also includes ADC 240, which converts the analog output of the loop filter amplifier to a 1-bit digital signal, and PWMC loop filter 250, which converts the 1-bit digital output of the ADC into a 16-bit signal that includes a polarity sign 252 for the output signal, which is provided to a feedback loop.

The amplifier feedback loop shown in FIG. 2 includes a digital dynamic element matching component (DEM) 260 and a digital-to-analog converter (DAC) 270.

The DEM 260 comprises a mission-mode DEM 262, which controls DAC 270 during normal operation of the amplifier and a CRME DEM 264, which controls DAC 270 under testing conditions as further described below. An amplified output signal deriving from the loop filter 230, ADC 240 and PWMC loop filter 250 is provided to the CRME DEM 264 to enable the CRME DEM 264 to control the DAC 270 according to the output signal and the sign or polarity 252 of the output signal as described below. Accordingly, the CRME DEM 264 is configured to adjust the DAC 270 to provide a number of different amplifier circuit configurations.

The DEM 264 is also able to remove mismatch present in different DAC cells by averaging out the mismatch by using different DAC cells to drive a bias voltage on the inputs of the loop filter 230.

The amplifier further comprises a common mode limit (CML) amplifier 280 that is controlled by a CML even harmonic distortion controller (EHDC) 282 to moderate the CM operation, and the transistors within the CM limit amplifier 280. Accordingly, the CML EHDC 282 is configured to adjust the CML amplifier 280 to provide a number of different amplifier circuit configurations.

Finally, the amplifier shown in FIG. 2 further comprises a low pass filter (LPF) 290, that provides an output signal $R_{meas}$ that represents the current ratio passing through selected circuit elements within the amplifier circuit. $R_{meas}$ is used to calculate adjustment parameters to tune the amplifier circuit, thereby improving the operational efficiency of the amplifier circuit, as further described below.

The CRME 112 is a built-in test circuit that is configured to cooperate with a processor that calculates a process error introduced into the resistor network 220 as well as calculates the current weighting of component mismatch and EHDC transistors in the CML 280. In the examples described herein, the processor is located off-chip as an ATE 130, however it will be appreciated that the inventive concept is not limited to such implementations. In other embodiments the measurements may be provided to an on-chip processor for calculating the process error instead.

In CRME mode, existing circuitry such as the loop filter 230, DAC 270, and PWMC loop filter 250 are configured to introduce currents into the loop filter 230. The ADC 240 will take the output from the loop filter 230 and send the digital results back into the DEM/DAC 260/270 block while concurrently sending the same digital result into a low pass filter 250 for consumption by the CRME 112. The CRME 112 will average the result over a selectable time period before storing the result into a first-in first-out (FIFO) memory ready for ATE 130 consumption. Provided the FIFO has valid data, the CRME 112 may signal to ATE 130 that results are ready. The ATE 130 will consume all the measurements for a given amplifier mode and perform any required post-processing of measurements to derive adjustment parameters for calibrating the resistors and transistors in the amplifier circuit. This process is then repeated for each amplifier mode, and all adjustment parameters are stored in an on-chip one-time programmable memory (OTP). During mission mode, i.e., the normal operation of the amplifier, the CRME 112 becomes inactive and consumes only leakage current.

CRME 112 records measurements to establish the component mismatch in the circuit elements of the amplifier circuit. This is achieved by driving a bias current through the positive and negative voltage rails of DAC 270 while CML 280 ensures the loop filter 230 remains within the common mode range limit. In preferred embodiments, the common mode range of loop filter 230 is 150-300 mV, however embodiments may support any voltage range, for example, 0-2V. The mismatch between two identified circuit elements creates an imbalance in the relative amount of current passing through each circuit element, which in turn causes loop filter 230 to generate a signal pattern that results in a measurement that represents the current ratio between the two circuit elements. Accordingly, the loop filter 230 is forced to act as a measurement controller to measure the component mismatch in circuit elements such as resistors and/or transistors. Iterative changes are made to the configuration of the amplifier circuit and its constituent components and a new measurement is recorded for each configuration until the number of unique configurations is exhausted.

During testing, the DEM 260 controls the voltage provided to each loop filter 230 input by selecting a particular combination of DAC 270 transistor cells to be activated at any one time. The number of activated transistor cells is balanced such that there is always an odd number of activated cells, thus forcing the DAC 270 to provide a higher current to either the positive input or the negative input. In some embodiments, the transistor cells may include 7 stages that are split 3:4, or 5 stages that are split 3:2, or 3 stages that are split 2:1 or 1 stage that are split 1:0. The number of stages is determined by the $R_z$ and $R_h$ resistor values to ensure that the bias voltage results in the loop filter 230 remaining within the common mode of operation. In a specific example, the current provided by the various stages of a particular DAC transistor cell is shown below in Table 1A and 1B for an example DAC bit current of 1.34684 micro Amps.

TABLE 1A

| DAC mode | Stage | Rz (Ohm) | Common mode: Rz (mV) | total DAC current (uA) | DAC Ip (uA) (sign = 1) | DAC In (uA) (sign = 1) | DAC Ip (uA) (sign = 0) | DAC In (uA) (sign = 0) |
|---|---|---|---|---|---|---|---|---|
| 11 | 7 | 4.5K | 254.55 | 113.134 | 64.648 | 48.486 | 48.486 | 64.648 |
| 10 | 5 | 5.653K | 228.41 | 80.81 | 48.486 | 32.324 | 32.324 | 48.486 |
| 01 | 3 | 7.523K | 182.38 | 48.486 | 32.324 | 16.162 | 16.162 | 32.324 |
| 01 | 3 | 11.391K | 276.15 | 48.486 | 32.324 | 16.162 | 16.162 | 32.324 |
| 00 | 1 | 22.781K | 184.09 | 16.162 | 16.162 | 0 | 0 | 16.162 |

TABLE 1B

| DAC mode | Stage | Rh (Ohm) | Common mode: Rh (mV) | total DAC current (uA) | DAC Ip (uA) (sign = 1) | DAC In (uA) (sign = 1) | DAC Ip (uA) (sign = 0) | DAC In (uA) (sign = 0) |
|---|---|---|---|---|---|---|---|---|
| 11 | 7 | 4.5K | 254.55 | 113.134 | 64.648 | 48.486 | 48.486 | 64.648 |
| 10 | 5 | 5.653K | 226.59 | 80.81 | 48.486 | 32.324 | 32.324 | 48.486 |
| 01 | 3 | 7.523K | 180.34 | 48.486 | 32.324 | 16.162 | 16.162 | 32.324 |
| 01 | 3 | 11.198K | 271.47 | 48.486 | 32.324 | 16.162 | 16.162 | 32.324 |
| 00 | 1 | 22.061K | 178.28 | 16.162 | 16.162 | 0 | 0 | 16.162 |

It will be noted that the bias voltage and current used during testing are significantly smaller than a typical audio signal that is usually driven through the amplifier.

The circuit configuration of the amplifier circuit is changed to iteratively select each possible combination of circuit element and a measurement is recorded for each circuit configuration, thereby establishing different circuit conditions for the same circuit elements which enables the component mismatch to be calculated. The configuration of the amplifier circuit may be changed by reconfiguring the circuitry of the amplifier circuit, for example by using the resistor network 220 switches. In preferred embodiments, although the DAC 270 provides a different amount of current to each input of the loop filter 230, the total current provided by the DAC 270 remains constant for a particular amplifier mode of operation. Accordingly, the voltage drop across the PWM switches (such as the PWMC switches 214, 216, 218) averages out over time, and so the varying resistance of the PWM switches can be ignored.

The configuration of the amplifier may also be changed by changing the circuit elements themselves, or by selecting which particular circuit elements are activated at any particular time.

In preferred embodiments, the CRME 112 is configured to adjust one or more of the PWMC 212, Rout controller 222, amplifier controller 232, DEM 260, mission DEM 262, CRME DEM 264 and CML EHDC 282 of the amplifier circuit in order to change the circuit configuration of the amplifier circuit. In preferred embodiments, this may be achieved by providing signals at the locations marked "crme_cfg_en_o" in FIG. 2.

In preferred embodiments, the output signal is passed through the ADC 240 to provide a measurement that has a 1-bit value and is then filtered by PWMC loop filter 250 to provide a measurement that has a 16-bit value, which may be used as the measurement result. In some embodiments, CRME 112 enables the measurement to be averaged over a measurement gathering interval. In preferred embodiments, the measuring gathering interval may be 0, 5.2, 10.4, 20.8, 41.6, 83.2, 166.4, 332.8 microseconds, though any other amount of time may also be used.

In preferred embodiments, the measurements are passed from CRME 112 to ATE 130 to calculate a plurality of adjustment parameters that may be used by DSM 114 to reconfigure the amplifier circuit to reduce component mismatch, and thus reduce even harmonic distortion. In preferred embodiments, the ATE 130 stores the adjustment parameters to an on-chip OTP, and the DSM 114 retrieves the adjustment parameters stored in the OTP and uses the adjustment parameters in real-time to tune the circuit elements within the amplifier circuit on the fly. In some embodiments, the DSM 114 interfaces with one or more of the PWMC 212, Rout controller 222, amplifier controller 232, CRME DEM 264 and CML EHDC 282 to adjust the circuit elements of the amplifier circuit according to the retrieved adjustment parameters. In some embodiments, the DSM 114 resides within one or more of the DAC 270 and/or ADC 240.

Figure 3:
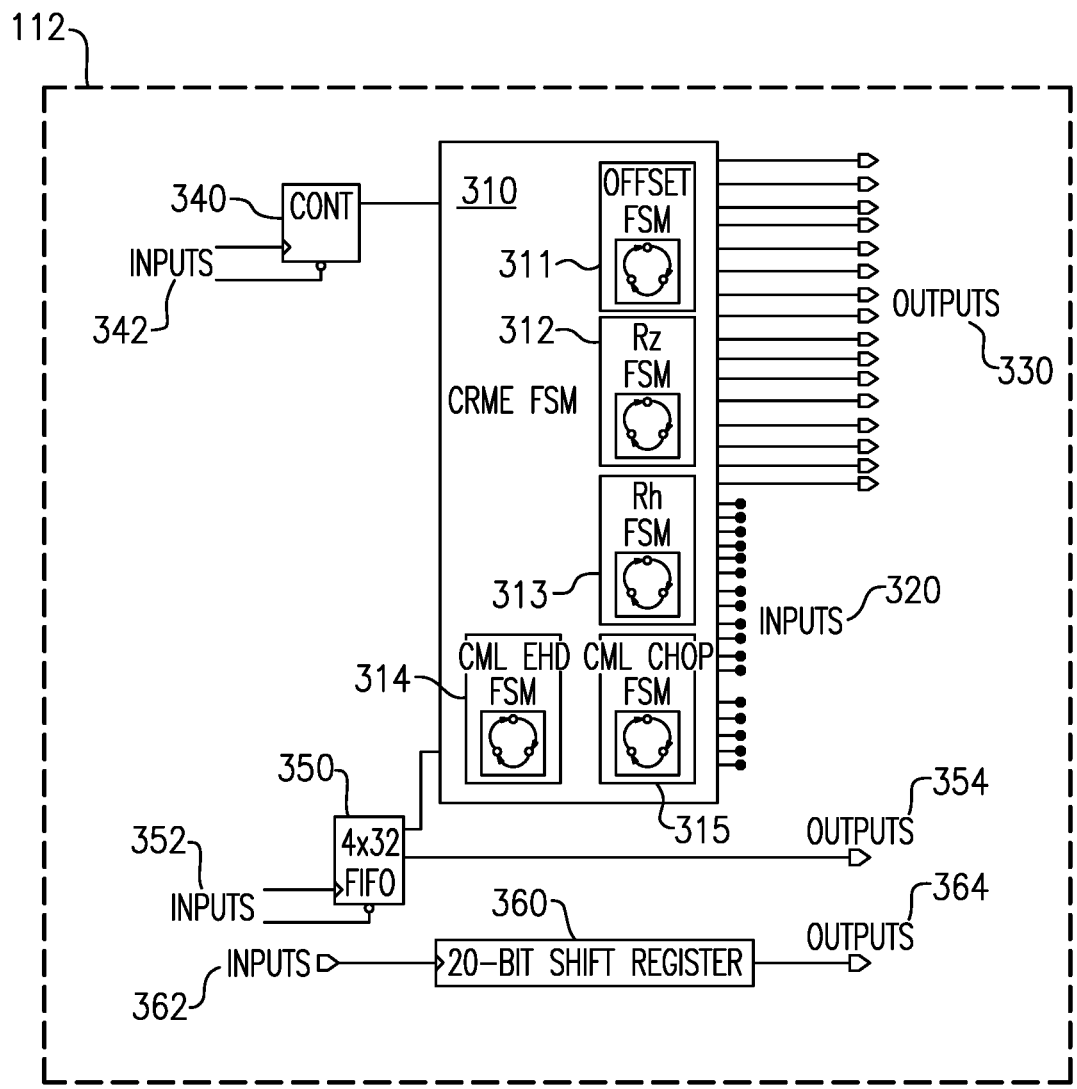
FIG. 3 is a schematic diagram of an example architecture of a current ratio measurement engine.

FIG. 3 shows an example architecture of a CRME 112, which includes a CRME finite state machine (FSM) 310 that receives a number of inputs 320 and provides a number of outputs 330.

In the embodiment shown in FIG. 3, the CRME FSM 310 includes an Offset FSM 311, an $R_Z$ FSM 312, an $R_h$ FSM 313, a CML EHD FSM 314 and a CML CHOP FSM 315.

Each FSM acts as a sequencer that monitors a particular series of events and circuit configurations that may be selected within the amplifier. For example, the $R_h$ FSM may monitor each of the circuit configurations associated with the $R_h$ path, including one or more of: the resistor values of Rhp, Rhn and Rs, the PWMC switches, the transistor configuration within the DAC 270, the transistor configuration within the CML 280, and the amplifier mode of the loop filter 230. The CRME FSM 310 may also monitor other configurations such as how much time to wait between measurements, how much averaging should occur, and how frequently to perform an offset voltage measurement.

Each FSM is responsible for iteratively cycling through all the possible circuit configurations. Each FSM also controls the timing of when each iterative change is made to allow the circuit to be reconfigured, to allow the current ratio measurement to settle, and to allow multiple measurements to be made to determine an average of the current ratio measurement value over a period of time, which enables some noise to be filtered from the measurement value.

Each FSM provides an output that includes a "signature," such as a unique hexadecimal code, that is paired with the measurement value. The signature is associated with the particular circuit configuration under test. Accordingly, the ATE 130 can determine the circuit configuration associated with a particular measurement.

In some embodiments, aspects of the CRME FSM 310 may be controlled based on signals received by a controller 340, which may itself be regulated by inputs 342, such as a clock signal. In preferred embodiments, the clock signal frequency may be 384 kHz, however other embodiments may use any frequency or frequency range, for example, 0-500 kHz.

Measurements may be temporarily stored in a first-in first-out (FIFO) memory 350, before measurements are passed to the ATE 130 for consumption. In some embodiments, the FIFO 350 may receive inputs 352 and provide one or more outputs 354, for example to provide the measurements to the ATE 130. In preferred embodiments, the CRME 112 signals to the ATE 130 that results are ready for processing as soon as the FIFO 350 is populated. In preferred embodiments, the FIFO 350 has a memory width of 32 bits and a memory depth of 4 (i.e., a 4×32 FIFO). This enables the ATE 130 to process some of the measurements stored within the FIFO 350 while ensuring the FIFO 350 has sufficient depth to continue to be populated with measurements.

Registers 360 record the particular iteration that the CRME FSM 310 has reached, for example by using counters to record a particular resistor value that is currently selected. In preferred embodiments, the register 360 is a 20-bit shift register as shown in FIG. 3, receives one or more inputs 362, and provides one or more outputs 364 to enable the CRME 112 to efficiently and systematically record measurements for a large number of circuit configurations.

Figure 4:
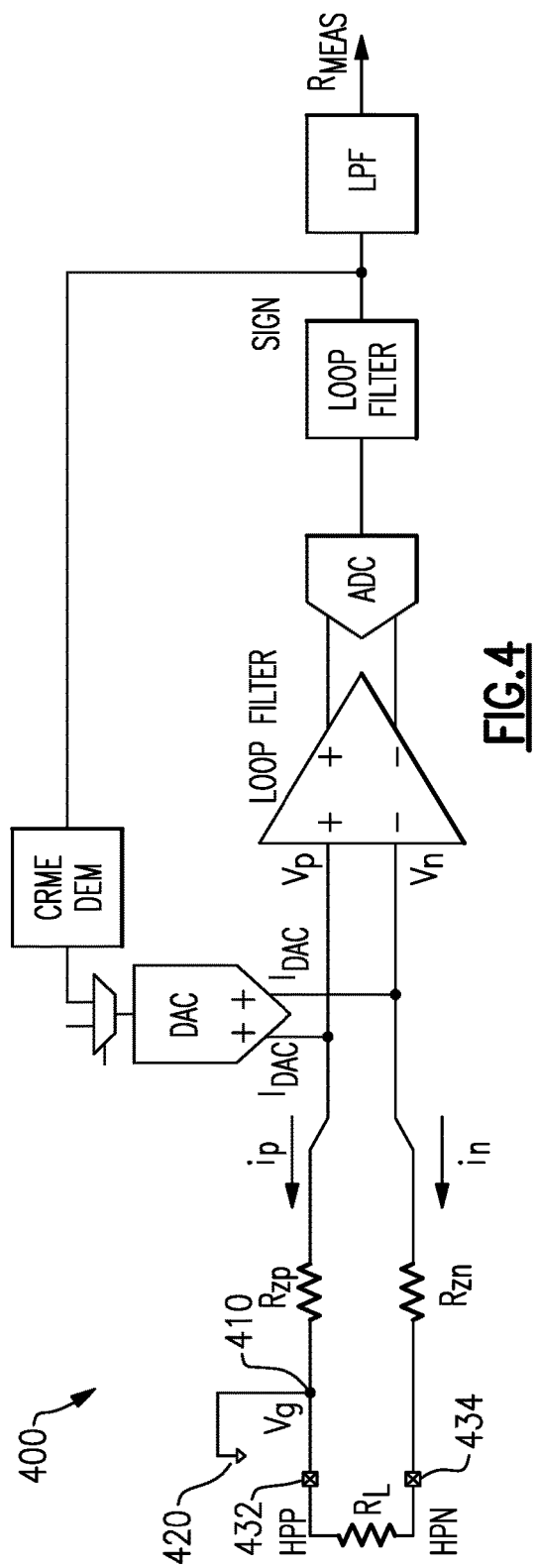
FIG. 4 is a schematic diagram of a first measurement circuit.

FIG. 4 shows a first measurement circuit 400 for determining an impedance mismatch in the $R_z$ path of system 200 of FIG. 2. The first measurement circuit 400 is provided by closing PWMC switch 216 and R-network switches 226, 227 and opening PWMC switches 214, 218 and R-network switches 224, 225, 228. As described above, the DAC 270 drives a bias current on the positive and/or negative voltage rails. A bias voltage ($V_p$ and $V_n$) set up on each of these rails drives the bias current ($i_p$ and $i_n$) through resistive paths connected to each rail. In the example shown in FIG. 4, the resistive path connected to the positive rail includes resistor $R_{zp}$ at terminates at ground 420 via node 410. The resistive path connected to the negative rail includes resistors $R_{zn}$ and $R_L$ and terminates at ground 420 via node 410. The first measurement circuit 400 may also include terminals for connecting $R_L$, including an HPP terminal 432 and an HPN terminal 434.

The bias voltage causes the loop filter 230 to generate a signal pattern that results in a measurement that corresponds to a ratio of the current through the resistive paths:

$$R_{meas} = \frac{i_p}{i_p + i_n} \quad (1)$$

Figure 5:
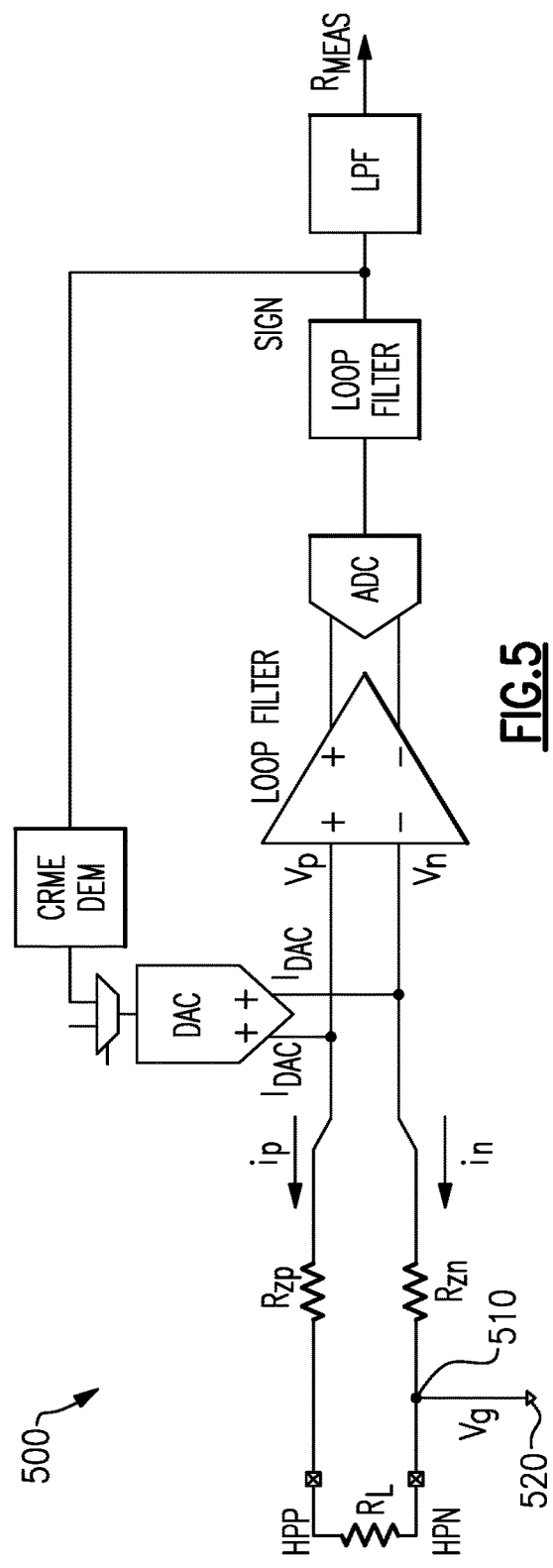
FIG. 5 is a schematic diagram of a second measurement circuit.

FIG. 5 shows a second measurement circuit 500 for determining an impedance mismatch in the $R_z$ path of system 200 of FIG. 2. The second measurement circuit 500 is provided by closing PWMC switch 218 and R-network switches 226, 227 and opening PWMC switches 214, 216 and R-network switches 224, 225, 228. The DAC 270 drives a bias current $i_p$ through a first resistive path that includes resistors $R_{zp}$ and $R_L$ and terminates at ground 520 via node 510. Bias current $i_n$ is driven through a second resistive path that includes resistor $R_{zn}$ and terminates at ground 520 via node 510.

Figure 6:
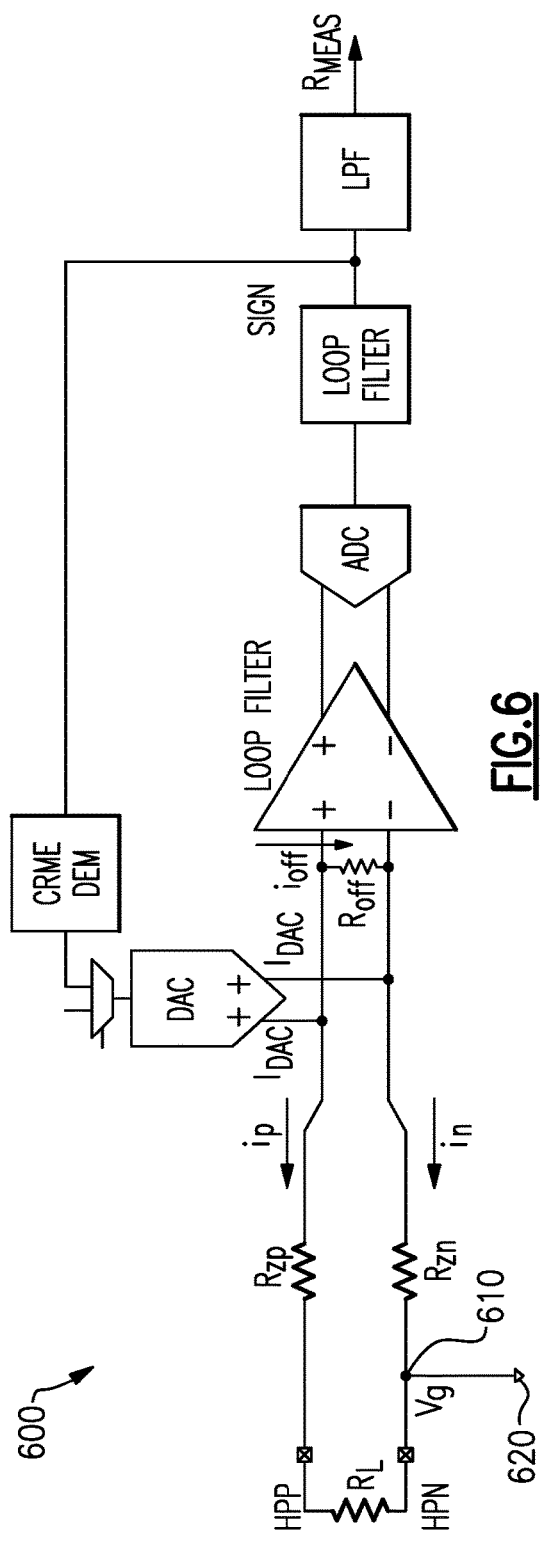
FIG. 6 is a schematic diagram of a third measurement circuit.

FIG. 6 shows a third measurement circuit 600 for determining an impedance mismatch in the $R_z$ path of system 200 of FIG. 2, which includes an offset resistance $R_{off}$ caused by an offset voltage between inputs of the loop filter 230. The third measurement circuit 600 is provided by closing PWMC switch 218 and R-network switches 226, 227, 228 and opening PWMC switches 214, 216 and R-network switches 224, 225. The DAC 270 drives a bias current $i_p$ through a first resistive path that includes resistor $R_{zp}$ and $R_L$ and terminates at ground 620 via node 610. Bias current $i_n$ is driven through a second resistive path that includes resistor $R_{zn}$ and terminates at ground 620 via node 610. It will be appreciated that although the example of FIG. 6 shows the resistor network being grounded at point 610, a different grounding point may be selected instead using the PWMC switches and R-network switches.

The effect of the offset resistance $R_{off}$ is that a small offset current $i_{off}$ is diverted from $i_p$ on the positive rail to ground 620 via $R_{off}$. Accordingly, this change in voltage ratio between $i_p$ and $i_n$ can be detected in order to calculate the value of an offset voltage between the loop filter inputs.

In an ideal situation for each of the above circuits, the ideal value of Voff is 0V, the ideal difference between Rzp and Rzn is 0 Ohms, and so the only current imbalance is due to the grounding of each resistive path in a slightly different location.

The CRME 112 records a value for $R_{meas}$ for each of the three measurement circuits above using different values of $R_z$ to thereby obtain a number of current ratio measurements for each respective measurement circuit. The following equations, which are derivable using Kirchoff's current laws, can then be used to determine the values of $R_{zp}$, $R_{zn}$, $R_L$, and $V_{off}$, as further described below.

$$i_p = \left(\frac{V_p - V_g}{R_{zp}}\right); i_n = \left(\frac{V_n - V_g}{R_{zn} + R_L}\right) \quad (2)$$

$$i_p = \left(\frac{V_p - V_g}{R_{zp} + R_L}\right); i_n = \left(\frac{V_n - V_g}{R_{zn}}\right) \quad (3)$$

$$R_{zp} = R_{zn}\left(\frac{1 - R_{meas}}{R_{meas}}\right)\left(\frac{V_p - V_g}{V_n - V_g}\right) - R_L \quad (4)$$

$$R_L = \frac{R_{zp}}{\left(\frac{1 - R_{meas}}{R_{meas}}\right)\left(\frac{V_p}{V_n - V_g}\right)} - R_{zn} \quad (5)$$

$$V_{off} = \frac{(V_n - V_g)(1 - X_{off})R_{off}}{(R_{off} + R_{zp} + R_L)X_{off} + R_{zn}} \quad (6)$$

where $V_p = V_n + V_{off}$ and where $$X_{off} = \left(\frac{1 - R_{meas}}{R_{meas}}\right)\left(\frac{R_{zn}}{R_{zp} + R_L}\right)$$

As indicated above, the $R_z$ value is iteratively changed by the CRME 112. In preferred embodiments, the CRME 112 provides a CRME_RZ_TRIM output, which determines the $R_z$ value to be selected based on the current operation mode of the loop filter amplifier. An example set of $R_z$ values is provided below in Table 2.

TABLE 2

| CRME_RZ_<br>TRIM[2:0]<br>value | Resistance<br>(Ohms)<br>(Amp mode = 2) | Resistance<br>(Ohms)<br>(Amp mode = 1) | Resistance<br>(Ohms)<br>(Amp mode = 0) |
|---|---|---|---|
| 000 | 4.5 k | 9.0 k | 90.0 k |
| 001 | 5.653 k | 11.306 k | 113.06 k |
| 010 | 7.523 k | 15.046 k | 150.46 k |
| 011 | 11.391 k | 22.782 k | 227.82 k |
| 100 | 22.781 k | 45.562 k | 455.62 k |
| 101 | Open<br>(infinite) | Open<br>(infinite) | Open<br>(infinite) |

The values of $R_L$ and $V_{off}$ are fixed and known, and so may be assumed with a reasonable degree of accuracy.

Software on the ATE 130 runs a solver algorithm to identify what the adjustment parameters should be, and writes those parameters into the OTP. As these parameters are specific to the chip, this test is a unique per-die test that enables individual chips to be tuned to maximum efficiency.

In some embodiments, the solver algorithm performs the following steps. First, an initial assumption is made for $V_n$, $V_{off}$, $R_L$, $R_{zp}$, $R_{zn}$ and total current ($i_p + i_n$). Values are calculated for $i_p$ and $i_n$ using equations (1), (2), and (3) above for the $R_h$ path and the $R_z$ path and are compared to the assumed $i_p$ and $i_n$ values. Similar calculations are made to calculate $i_p$ and $i_n$ values for an offset voltage. If at any time the error is greater than 0.000001%, then the assumed value of $V_n$ is adjusted, and the calculation repeated. Finally, a calculated $R_{meas}$ is compared to a measured $R_{meas}$ value and if the error is greater than 0.000001% then the assumed values of $V_{off}$, $R_{zp}$, and $R_L$ are adjusted and the entire process is repeated.

Figure 7:
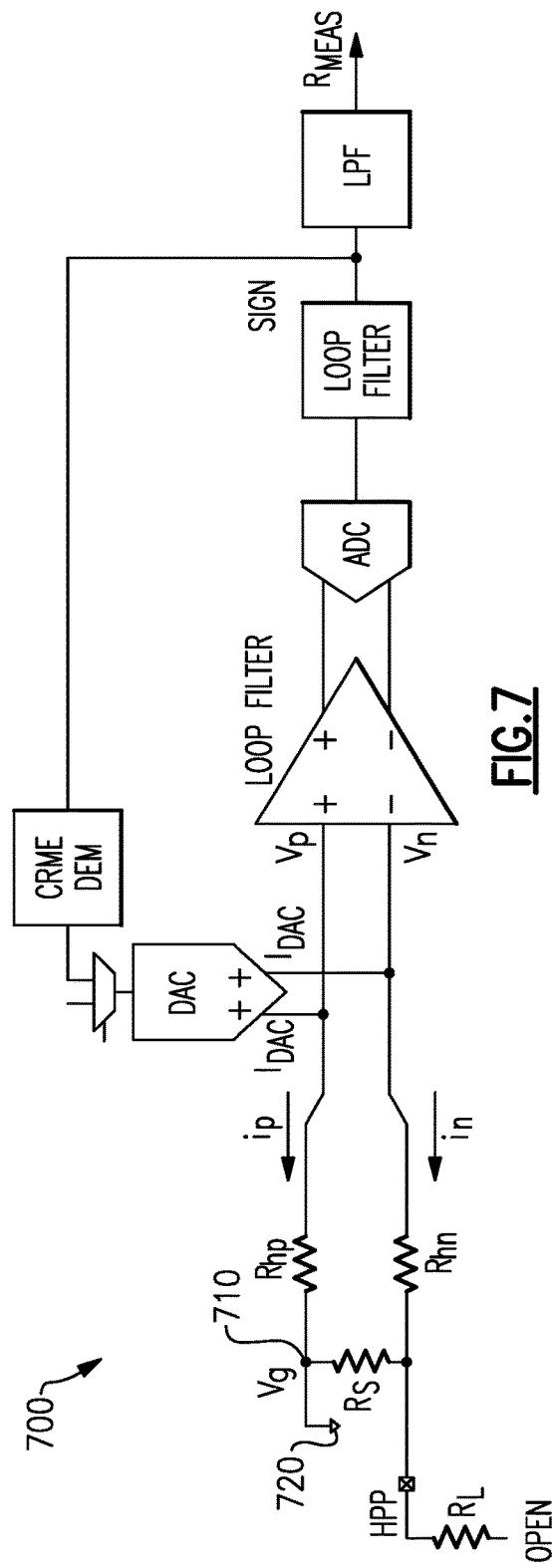
FIG. 7 is a schematic diagram of a fourth measurement circuit.

FIG. 7 shows a fourth measurement circuit 700 for determining an impedance mismatch in the $R_h$ path of system 200 of FIG. 2. The fourth measurement circuit 700 is provided by closing PWMC switch 214 and R-network switches 224, 225 and opening PWMC switches 216, 218 and R-network switches 226, 227, 228. The DAC 270 drives a bias current $i_p$ through a first resistive path that includes resistor $R_{hp}$ and terminates at ground 720 via node 710. Bias current $i_n$ is driven through a second resistive path that includes resistors $R_{hn}$ and $R_s$ and terminates at ground 720 via node 710.

Figure 8:
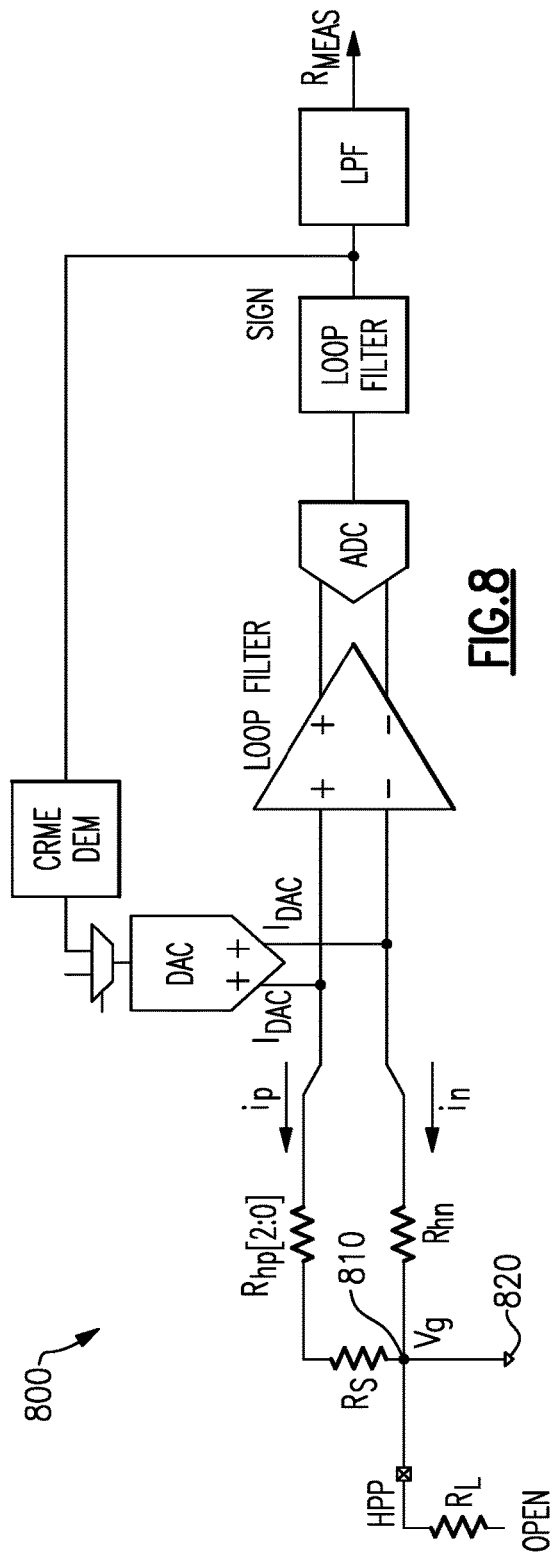
FIG. 8 is a schematic diagram of a fifth measurement circuit.

FIG. 8 shows a fifth measurement circuit 800 for determining an impedance mismatch in the $R_h$ path of system 200 of FIG. 2. The fifth measurement circuit 800 is provided by closing PWMC switch 216 and R-network switches 224, 225 and opening PWMC switches 214, 218 and R-network switches 226, 227, 228. The DAC 270 drives a bias current $i_p$ through a first resistive path that includes resistors $R_{hp}$ and $R_s$ and terminates at ground 820 via node 810. Bias current $i_n$ is driven through a second resistive path that includes resistor $R_{hn}$ and terminates at ground 820 via node 810.

Again, as for the $R_z$ path, the bias voltage established at the inputs of the loop filter 230 results in a measurement that corresponds to a ratio of the current through the resistive paths:

$$R_{meas} = \frac{i_p}{i_p + i_n} \quad (7)$$

The CRME 112 records a value for $R_{meas}$ for each of the two measurement circuits above using different values of $R_h$ and $R_s$ to thereby obtain a number of current ratio measurements for each respective measurement circuit. The following equations, which are derivable using Kirchoff's current laws, can then be used to determine the values of $R_{hp}$, $R_{hn}$, and $R_s$ using an iterative solver, as further described below.

$$i_p = \left(\frac{V_p - V_g}{R_{hp}}\right); i_n = \left(\frac{V_n - V_g}{R_{hn} + R_S}\right) \quad (8)$$

$$i_p = \left(\frac{V_p - V_g}{R_{hp} + R_s}\right); i_n = \left(\frac{V_n - V_g}{R_{hn}}\right) \quad (9)$$

$$R_{hp} = R_{hn}\left(\frac{1 - R_{meas}}{R_{meas}}\right)\left(\frac{V_p - V_g}{V_n - V_g}\right) - R_s \quad (10)$$

$$R_s = \frac{R_{hp}}{\left(\frac{1 - R_{meas}}{R_{meas}}\right)\left(\frac{V_p - V_g}{V_n - V_g}\right)} - R_{hn} \quad (11)$$

As indicated above, the $R_h$ value is iteratively changed by the CRME 112. In preferred embodiments, the CRME 112 provides a CRME_RH_TRIM output, which determines the $R_h$ value to be selected based on the current operation mode of the loop filter amplifier. An example set of $R_h$ values is provided below in Table 3.

TABLE 3

| CRME_RH_TRIM [2:0] value | Resistance (Ohms) (Amp mode = 2) | Resistance (Ohms) (Amp mode = 1) | Resistance (Ohms) (Amp mode = 0) |
|---|---|---|---|
| 000 | 4.5 k | 9.0 k | 90.0 k |
| 001 | 5.608 k | 11.216 k | 112.16 k |
| 010 | 7.439 k | 14.878 k | 148.78 k |
| 011 | 11.198 k | 22.396 k | 223.96 k |
| 100 | 22.061 k | 44.122 k | 441.252 k |
| 101 | Open (infinite) | Open (infinite) | Open (infinite) |

The $R_s$ value may also be iteratively changed by the CRME 112. In preferred embodiments, the CRME provides a CRME_RS_TRIM output, which determines the $R_s$ value to be selected based on the current operation mode of the loop filter amplifier. An example set of $R_s$ values is provided below in Table 4.

TABLE 4

| CRME_RS_TRIM [4:0] value | Resistance (Ohms) (Amp mode = 2) | Resistance (Ohms) (Amp mode = 0, 1) |
|---|---|---|
| 00101 | 64 ǁ 256 | N/A |
| 00110 | 64 ǁ 128 | N/A |
| 00100 | 64 | 64 |
| 01000 | 32 | 32 |
| 10000 | 16 | 16 |

In some embodiments, the 256 Ohm and 128 Ohm resistors do not have direct feedback paths through the $R_h$ network, but are tested in parallel with the 64 Ohm resistor when the CRME_RS_TRIM values 00101 and 00110 respectively. It will be understood that the resistors are not limited to the resistances given herein, and may be of any resistance.

Software on the ATE 130 runs a solver algorithm to identify what the adjustment parameters should be, and writes those parameters into the OTP. As these parameters are specific to the chip, this test is a unique per-die test that enables individual chips to be tuned to maximum efficiency.

In some embodiments, the solver algorithm performs the same steps as described above for solving $R_z$ by using equations (7) to (11) and making initial assumptions for the values of $V_n$, $V_{off}$, $R_S$, $R_{hp}$, $R_{hn}$ and total current ($i_p+i_n$).

Figure 9:
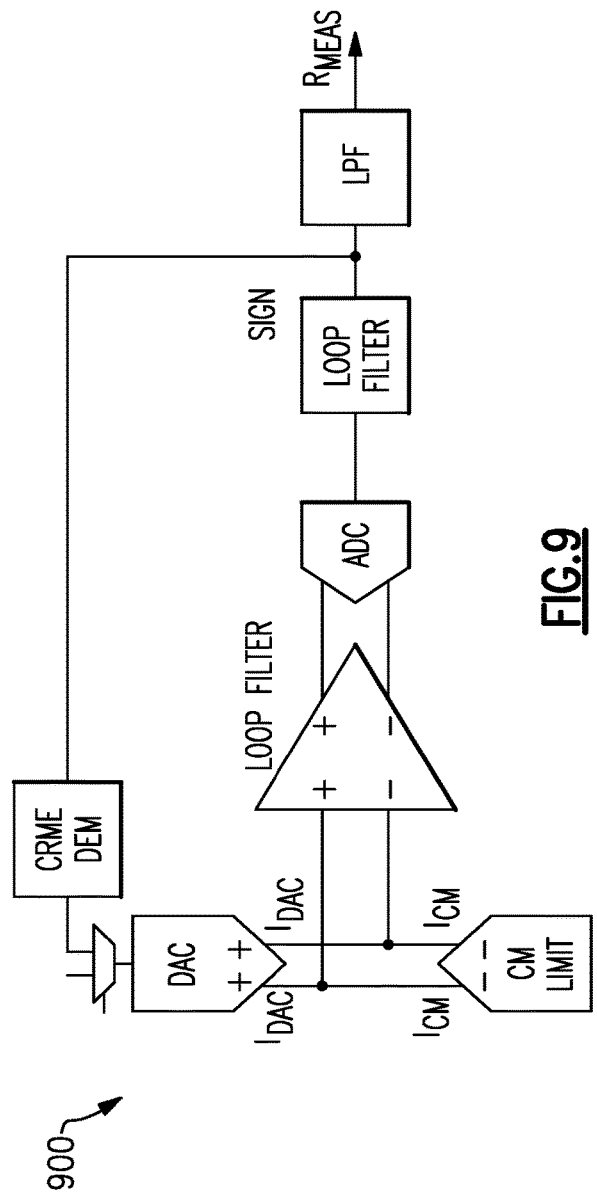
FIG. 9 is a schematic diagram of a sixth measurement circuit.

FIG. 9 shows a sixth measurement circuit 900 for determining an impedance mismatch in the transistors of CML 280. In some embodiments, CML 280 includes two types of transistors: chop transistors and even harmonic distortion (EHD) transistors. For each set of transistors, the sixth measurement circuit 900 provides a direct measurement of the current ratio presented by the CML 280 to the positive and negative inputs of loop filter 230. In preferred embodiments, the chop transistors of the CML are arranged in 3 banks of 20 transistors and the EHD transistors are arranged in 3 banks of 14 transistors.

The CRME 112 first tests the relative impedance imbalance between pairs of chop transistors by iteratively testing each combination of transistors and measuring a resulting current ratio. For example, in a first transistor pattern a set of 10 transistors (numbered 1 to 10) may be balanced against the remaining 10 transistors (numbered 11 to 20). A first hexadecimal code, for example 0x3ff, may be associated with this particular transistor pattern. The DAC 270 provides an additional bias current in order to balance the current pull of the first set of transistors against the second set of transistors, with the bias current (representing a current imbalance between the sets of transistors) being passed through the loop filter 230 and detected as a current ratio measurement. If the current ratio measurement is exactly 1.00 then the two pairs of transistors are perfectly balanced. The transistor pattern is then iteratively changed by 1 transistor and the process repeated until every possible transistor pattern in the first bank of transistors has been tested. The process is then repeated for the remaining banks of transistors in the CML.

Once these measurements have been made, the captured data is processed by first resolving scaling factors that are applied to the measurement due to the gain of LPF 290. The DAC 270 also contributes to the scaling of the output measurement because when the DAC 270 is outputting a positive current pulse, the DAC 270 provides one unit of current more to the positive rail than to the negative rail. For example, the DAC 270 may provide 4 units of current to the positive rail and 3 units of current to the negative rail. That is, the ratio of current provided to the positive rail compared to the negative rail could be 4:3. Alternatively, the DAC 270 may provide 3 units of current to the positive rail and 2 units of current to the negative rail when outputting a positive current pulse. Thus, the output needs to be scaled to properly to compensate for the above factors.

The scaled measurements are then provided to an off-chip iterative solver, which may be located in the ATE 130, to identify chop transistor adjustment parameters. The iterative solver determines the strength of each of the 20 transistors for a particular bank of transistors by comparing an estimated transistor strength for a selected transistor against the corresponding measurement for the selected transistor. If the measurement does not match the estimated transistor strength, then the estimated strength of each transistor in the bank is adjusted to try and arrive at a closer match. This process is iterated for each transistor, such that the net adjustment to a particular transistor is the result of 20 individual adjustments for the entire bank of transistors. This process is repeated for the bank of transistors until a unique solution is found where the estimated transistor strength matches a corresponding measurement for each transistor and the adjustments may be stored to the OTP as chop transistor adjustment parameters.

Once the transistor strengths have been determined, an exhaustive solver determines which transistor pattern results in a minimum imbalance between a first set of 10 transistors and a second set of 10 transistors for each transistor bank. As with the iterative solver, the exhaustive solver may be located on the ATE 130. This transistor pattern is captured and stored into OTP.

The entire process is then repeated for each of the other 2 banks of 20 transistors.

In preferred embodiments, an optimizer identifies the two sets of 10 transistors that balance each other to provide the minimum error—i.e., provides a current ratio measurement closest to 1.00. The optimizer may be located on the ATE 130.

Once the correct values associated with each chop transistor have been determined, as described above, the CRME 112 measures the impedance imbalance in the EHD transistors using the determined chop transistor values. When doing so, the operation of the chop transistors is changed such that the transistors are "chopped" and switched from side to side in order to minimize the effect that the chop transistors have on the EHD transistor measurements. Thus, it is assumed the chop transistors provide a current ratio of 1.00.

The CRME 112 tests the relative impedance imbalance in the EHD transistors in a similar way as described above for the chop transistors; namely, using the DAC 270 to balance the current pull of each of the EHD transistors. For each of the 3 banks of EHD transistors, the CRME 112 enables each of the 14 EHD transistors separately in turn and takes a corresponding measurement, first with each of the transistors enabled on the positive rail and then enabled on the negative rail resulting in a total of 84 separate measurements. These measurements are then provided to the ATE 130 to generate EHD transistor adjustment parameters.

As described above, once the measurements for the EHD transistors have been made the captured data is first processed to resolve scaling factors that are applied to the measurement by the LFP 290 and CRME DEM 264.

The measured current strength of each transistor is determined by averaging the measurement for the positive rail and the inverse of the measurement for the negative rail for each respective transistor. The measured current strength for a selected transistor is then compared against an ideal current for the transistor, and the ideal current is then adjusted to match the measured current strength and the adjustments may be stored to the OTP as EHD transistor adjustment parameters.

In some embodiments, the CRME 112 is further configured to perform current ratio measurements in the manner described above for each CM drive mode, wherein the CM drive modes may be a $V_L V_M$ mode, a $V_H$ mode or a battery voltage $V_{batt}$ mode, where $V_H$ is a highest level voltage, $V_L$ is a lower level voltage, and $V_M$ is a mid-range voltage greater than $V_L$ and less than $V_H$.

Figure 10:
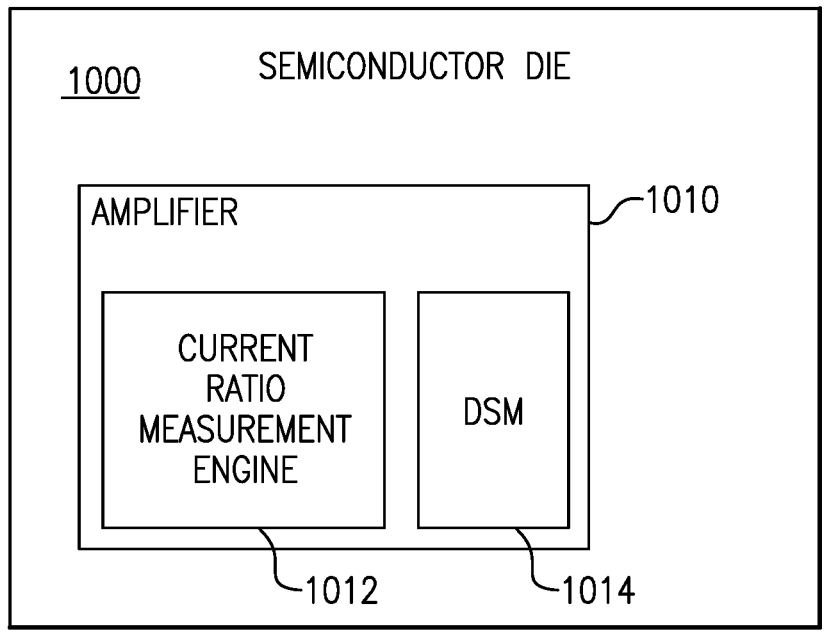
FIG. 10 is a schematic diagram of an example semiconductor die with an amplifier implemented thereon.

In some embodiments, an electronic component such as an amplifier having one or more features as described herein can be implemented in a number of products. For example, FIG. 10 shows that in some embodiments, an amplifier 1010 including a CRME 1012 and DSM 1014 having one or more features as described herein can be implemented on a semiconductor die 1000.

Figure 11:
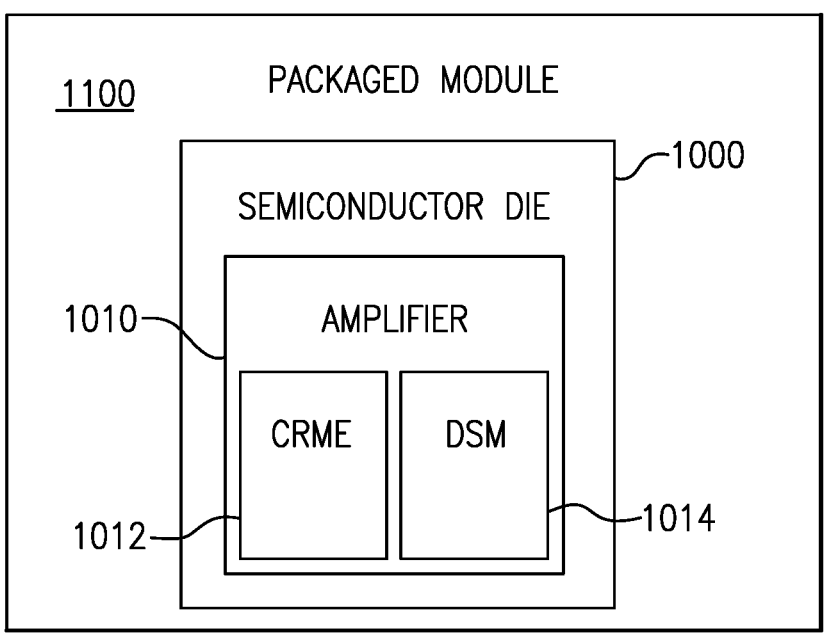
FIG. 11 is a schematic diagram of an example packaged module with an amplifier implemented thereon.

FIG. 11 shows that in some embodiments, an amplifier 1010 having one or more features as described herein can be implemented on a packaged module 1100. FIG. 11 shows that in some embodiments, an amplifier 1010 including a CRME 1012 and DSM 1014 can be implemented on one or more semiconductor die 1000, and such die can be mounted on a packaging substrate of the packaged module.

Figure 12:
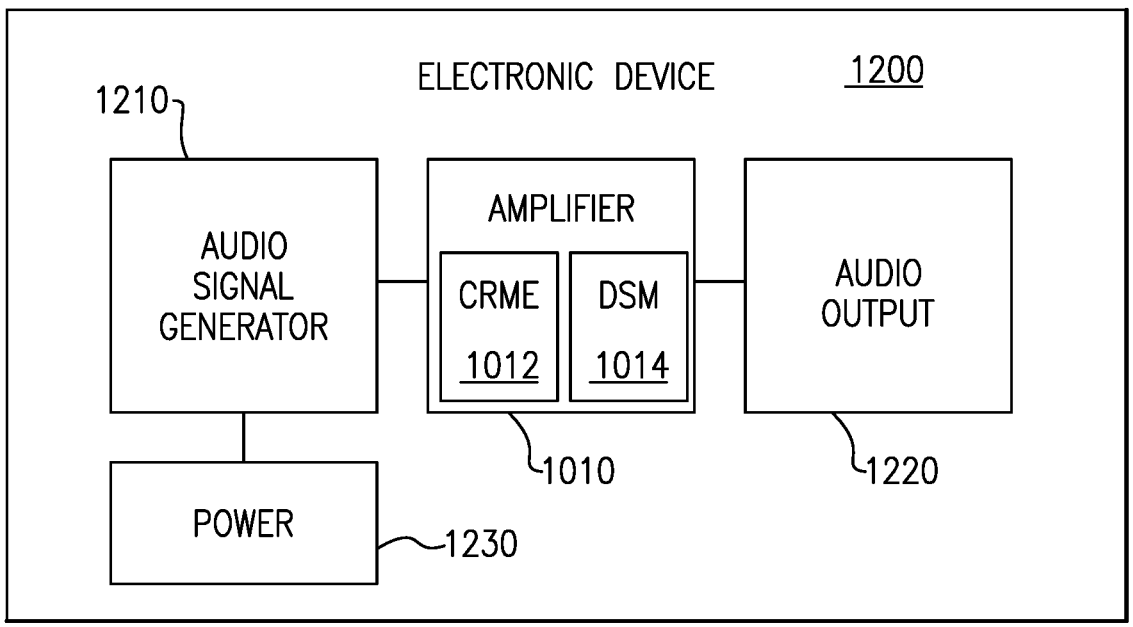
FIG. 12 is a schematic diagram of an example electronic device that includes an amplifier.

FIG. 12 shows that in some embodiments, an electronic device 1200 can include an amplifier 1010 having one or more features as described herein. Such an electronic device can include an amplifier 1010 including a CRME 1012 and DSM 1014 as described herein. Such an amplifier can receive a signal to be amplified from an audio signal generator 1210, and output an amplified audio signal to an audio output device 1220. In the example of FIG. 12, the electronic device 1200 can also include a power source 1230 configured to provide power to various components, including the amplifier 1010.

Figure 13:
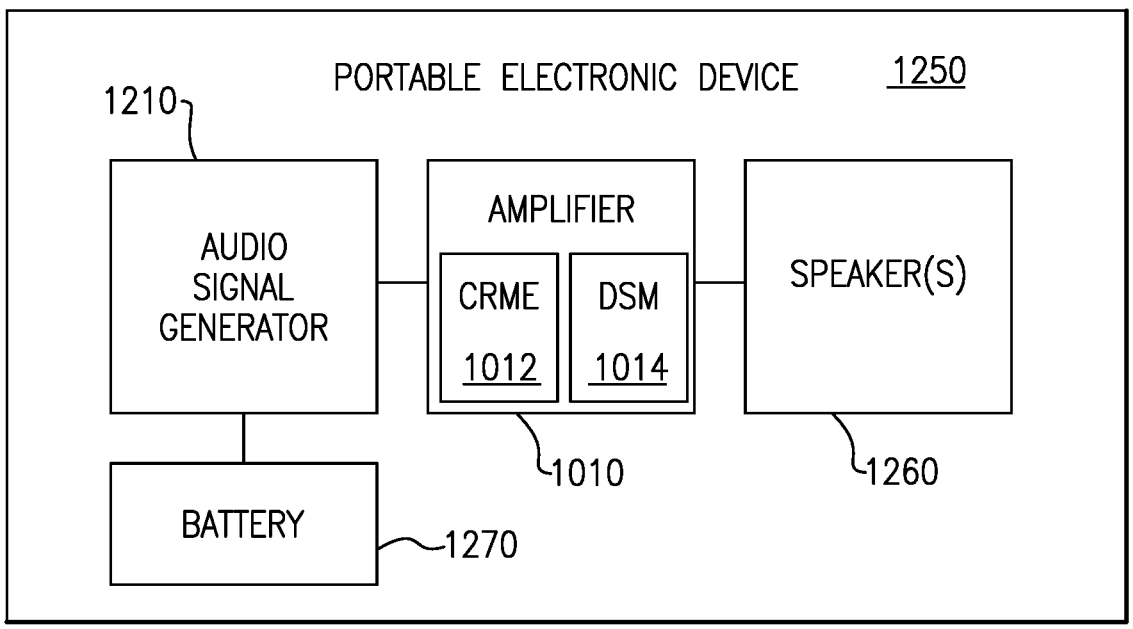
FIG. 13 is a schematic diagram of an example portable electronic device that includes an amplifier.

FIG. 13 shows a more specific example of the electronic device 1200 of FIG. 12. In FIG. 13, a portable electronic device 1250 can include an amplifier 1010 as described herein. Such an electronic device can include an amplifier 1010 including a CRME 1012 and DSM 1014 as described herein. Such an amplifier can receive a signal to be amplified from an audio signal generator 1210, and output an amplified audio signal to one or more speakers 1260. In the example of FIG. 13, the portable electronic device 1250 can also include a power source implemented in the form of a battery 1270 and such battery can provide power to various components, including the amplifier 1010. In some implementations, the portable electronic device 1250 of FIG. 13 can be, for example, a cellular phone, a smart-phone, a hand-held wireless device with or without phone functionality, a wireless tablet, etc.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of compensating for component mismatch in an amplifier circuit, the amplifier circuit having a plurality of circuit configurations, the method comprising:

providing a first circuit configuration of the plurality of circuit configurations that includes two or more circuit elements from a plurality of circuit elements within the amplifier circuit;

driving a bias current through the two or more circuit elements and measuring a ratio of a current between each circuit element in the first circuit configuration;

providing a second circuit configuration of the plurality of circuit configurations that includes two or more circuit elements from a plurality of circuit elements within the amplifier circuit;

driving a bias current through the two or more circuit elements and measuring a ratio of a current between each circuit element in the second circuit configuration;

providing the current ratio measurements to a processor;

receiving, from the processor, a set of adjustment parameters that are calculated based on the current ratio measurements; and reconfiguring the amplifier circuit in accordance with the set of adjustment parameters received from the processor.

2. The method of claim 1 wherein each circuit configuration of the plurality of circuit configurations is provided by changing the arrangement of the two or more circuit elements, and/or by changing a value associated with the two or more circuit elements.

3. The method of claim 1 wherein one or more different circuit configurations are provided by adjusting an internal resistor network of the amplifier with a plurality of switches.

4. The method of claim 1 wherein one or more different circuit configurations are provided by selecting either a resistive path associated with a high output resistance mode of the amplifier circuit or a resistive path associated with a zero output resistance mode of the amplifier circuit with an internal resistor network controller.

5. The method of claim 1 wherein one or more different circuit configurations are provided by activating a subset of transistors within a digital-to-analog converter of the amplifier circuit with a dynamic element matching component.

6. The method of claim 1 wherein one or more different circuit configurations are provided by activating a subset of transistors within a common mode limit amplifier of the amplifier circuit with a common mode limit amplifier controller.

7. The method of claim 1 wherein each of the plurality of circuit configurations is monitored and iteratively selected using a finite state machine.

8. The method of claim 1 wherein the strength of the bias current driven through the two or more circuit elements ensures that a loop filter amplifier in the amplifier circuit remains within a common mode of operation.

9. The method of claim 1 wherein the current ratio measurements are obtained from an output of a loop filter amplifier.

10. The method of claim 1 wherein the set of received adjustment parameters are stored in an on-chip one-time programmable memory.

11. The method of claim 1 wherein the plurality of current ratio measurements are provided to the processor via an on-chip first-in first-out memory.

12. The method of claim 1 wherein each of the plurality of current ratio measurements may be an average current ratio determined during a measurement gathering interval.

13. The method of claim 1 wherein each of the plurality of current ratio measurements may be an average current ratio determined during a measurement gathering interval.

14. A system of compensating for component mismatch in an amplifier circuit, the system comprising:
an amplifier circuit including a plurality of circuit elements;
a current ratio measurement engine configured to provide a plurality of circuit configurations, each configuration including two or more circuit elements of the plurality of circuit elements;
a digital-to-analog converter configured to drive a bias current through the two or more circuit elements for each of the plurality of circuit configurations to obtain a plurality of current ratio measurements;
a modulator configured to receive a set of adjustment parameters that are calculated based on the plurality of current ratio measurements and to reconfigure the amplifier circuit in accordance with the set of adjustment parameters.

15. The system of claim 14 further comprising a plurality of switches configured to provide one or more different circuit configurations by adjusting an internal resistor network.

16. The system of claim 14 further comprising an internal resistor network controller configured to provide one or more different circuit configurations by selecting either a resistive path associated with a high output resistance mode or a resistive path associated with a zero output resistance mode.

17. The system of claim 14 further comprising a dynamic element matching component configured to activate a subset of transistors within the digital-to-analog converter to thereby provide one or more different circuit configurations.

18. The system of claim 14 further comprising a common mode limit amplifier controller configured to activate a subset of transistors within the common mode limit amplifier to thereby provide one or more different circuit configurations.

19. The system of claim 14 wherein the current ratio measurement engine further comprises a finite state machine configured to monitor and iteratively select each of the plurality of circuit configurations of the amplifier circuit.

20. A packaged module comprising:
a packaging substrate; and
an amplifier implemented on a packaging substrate, the amplifier comprising an amplifier circuit including a plurality of circuit elements, a current ratio measurement engine configured to provide a plurality of circuit configurations, each configuration including two or more circuit elements of the plurality of circuit elements, a digital-to-analog converter configured to drive a bias current through the two or more circuit elements for each of the plurality of circuit configurations to obtain a plurality of current ratio measurements, and a modulator configured to receive a set of adjustment parameters that are calculated based on the plurality of current ratio measurements and further configured to reconfigure the amplifier circuit in accordance with the set of adjustment parameters.

* * * * *